US012635389B2

(12) United States Patent
Peng et al.

(10) Patent No.: US 12,635,389 B2
(45) Date of Patent: May 19, 2026

(54) MANUFACTURING METHOD FOR DISPLAY PANEL, DISPLAY PANEL, AND DISPLAY DEVICE

(71) Applicants: Mianyang BOE Optoelectronics Technology Co., Ltd., Mianyang (CN); BOE Technology Group Co., Ltd., Beijing (CN)

(72) Inventors: Le Peng, Beijing (CN); Yunte Chen, Beijing (CN); Yingxi Cui, Beijing (CN); Xuepei Cheng, Beijing (CN); Lubiao Sun, Beijing (CN); Huina Qiao, Beijing (CN); Zhengde Liu, Beijing (CN); Qiang Guo, Beijing (CN); Xuelin Zou, Beijing (CN); Mengxin Xian, Beijing (CN)

(73) Assignees: MIANYANG BOE OPTOELECTRONICS TECHNOLOGY CO., LTD., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 790 days.

(21) Appl. No.: 17/914,575

(22) PCT Filed: Oct. 18, 2021

(86) PCT No.: PCT/CN2021/124318
§ 371 (c)(1),
(2) Date: Sep. 26, 2022

(87) PCT Pub. No.: WO2022/111122
PCT Pub. Date: Jun. 2, 2022

(65) Prior Publication Data
US 2023/0209974 A1 Jun. 29, 2023

(30) Foreign Application Priority Data

Nov. 25, 2020 (CN) .......................... 202011339383.7

(51) Int. Cl.
H10K 59/80 (2023.01)
H10K 59/12 (2023.01)
H10K 59/40 (2023.01)

(52) U.S. Cl.
CPC ..... *H10K 59/8731* (2023.02); *H10K 59/1201* (2023.02); *H10K 59/40* (2023.02)

(58) Field of Classification Search
None
See application file for complete search history.

(56) References Cited

U.S. PATENT DOCUMENTS 10,957,757 B2    3/2021 Youn et al.
11,088,350 B2    8/2021 Guo et al.
(Continued)

FOREIGN PATENT DOCUMENTS

CN    107887417 A    4/2018
CN    110061043 A    7/2019
(Continued)

OTHER PUBLICATIONS

International Search Report issued Jan. 18, 2022 in International Application No. PCT/CN2021/124318, 4 pages.
(Continued)

*Primary Examiner* — Kyoung Lee
(74) *Attorney, Agent, or Firm* — XSENSUS LLP

(57) ABSTRACT
A manufacturing method for a display panel, the display panel, and a display device are provided. The manufacturing method includes: providing a driving backplane; forming an inorganic encapsulation layer on the driving backplane using a vapor deposition method, so that the inorganic encapsulation layer includes a main encapsulation layer covering the
(Continued)

display area and a part of the peripheral area and an infiltration layer extending from the main encapsulation layer towards a direction away from the display area; forming an inorganic layer on a side of the inorganic encapsulation layer away from the driving backplane, so that the inorganic layer includes a first inorganic layer covering the main encapsulation layer and a second inorganic layer extending from the first inorganic layer towards the direction away from the display area; and simultaneously etching the second inorganic layer and the infiltration layer using a same mask to remove them.

18 Claims, 7 Drawing Sheets

(56) References Cited

U.S. PATENT DOCUMENTS

| | | |
|---|---|---|
| 2010/0182274 A1 | 7/2010 | Kang et al. |
| 2018/0097034 A1 | 4/2018 | Lee et al. |
| 2020/0176550 A1 | 6/2020 | Youn et al. |
| 2020/0350512 A1* | 11/2020 | Guo ....................... H10K 59/12 |
| 2021/0210590 A1 | 7/2021 | Youn et al. |
| 2021/0336208 A1 | 10/2021 | Liu et al. |

FOREIGN PATENT DOCUMENTS

| | | |
|---|---|---|
| CN | 111128010 A | 5/2020 |
| CN | 111785855 A | 10/2020 |
| CN | 111796718 A | 10/2020 |
| CN | 112467061 A | 3/2021 |
| EP | 3 660 919 A2 | 6/2020 |
| EP | 3 660 919 A3 | 8/2020 |
| EP | 3 754 719 A1 | 12/2020 |
| EP | 3 874 541 A1 | 9/2021 |
| WO | 2020/087868 A1 | 5/2020 |

OTHER PUBLICATIONS

Written Opinion of the International Searching Authority issued Jan. 18, 2022 in International Application No. PCT/CN2021/124318, 4 pages.
Office Action issued Jun. 6, 2022 in Chinese Patent Application No. 202011339383.7, 17 pages.

* cited by examiner

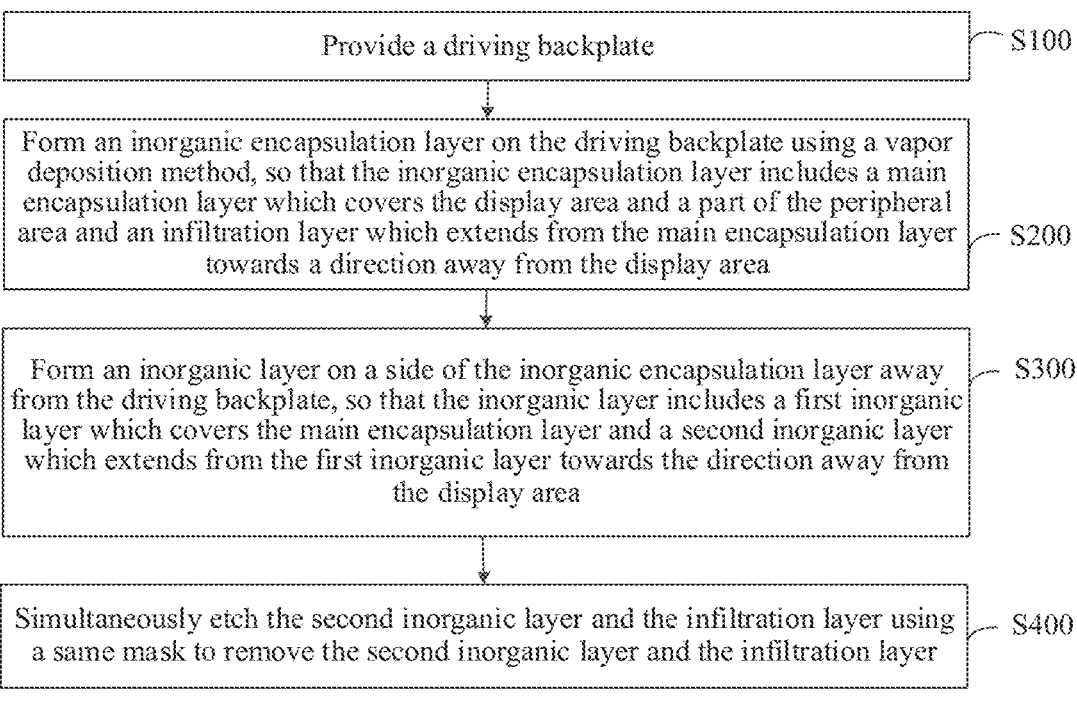

| | |
|---|---|
| Provide a driving backplate | S100 |
| Form an inorganic encapsulation layer on the driving backplate using a vapor deposition method, so that the inorganic encapsulation layer includes a main encapsulation layer which covers the display area and a part of the peripheral area and an infiltration layer which extends from the main encapsulation layer towards a direction away from the display area | S200 |
| Form an inorganic layer on a side of the inorganic encapsulation layer away from the driving backplate, so that the inorganic layer includes a first inorganic layer which covers the main encapsulation layer and a second inorganic layer which extends from the first inorganic layer towards the direction away from the display area | S300 |
| Simultaneously etch the second inorganic layer and the infiltration layer using a same mask to remove the second inorganic layer and the infiltration layer | S400 |

FIG. 3

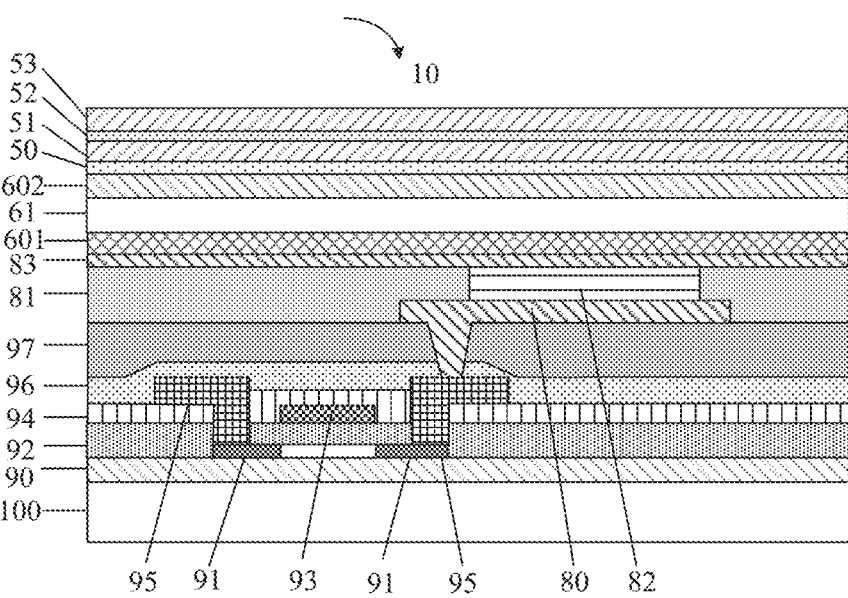

FIG. 4

MANUFACTURING METHOD FOR DISPLAY PANEL, DISPLAY PANEL, AND DISPLAY DEVICE

CROSS-REFERENCE TO RELATED APPLICATIONS

The present application is a 371 application of PCT Application No. PCT/CN2021/124318 filed on Oct. 18, 2021, which claims the benefit of and priority to Chinese Patent Application No. 202011339383.7, filed on Nov. 25, 2020 and titled "MANUFACTURING METHOD FOR DISPLAY PANEL, DISPLAY PANEL, AND DISPLAY DEVICE", contents of which are incorporated by reference herein in their entireties.

TECHNICAL FIELD

The present disclosure relates to the display technical field, and in particular, to a manufacturing method for manufacturing a display panel, a display panel and a display dev ice.

BACKGROUND

Flexible Multi-Layer On Cell (FMLOC) design is currently the mainstream in the field of OLED touch display, especially in the mobile phone screen industry, FMLOC is a main direction of technologies. The FMLOC design refers to manufacturing a metal grid electrode layer on a package driving backplane of a display panel, so as to perform touch control without external ouch Screen Panel (TSP). This process can reduce the thickness of the screen, improve yield and reduce costs.

A display panel with the FMLOC structure has many inorganic film layers. Once internal water vapor cannot be discharged smoothly, it is easy to form bubbles inside the film layers (commonly known as bubble deficiency). The bubbles will cause corresponding separation of film layers, and in severe cases, the film layers will be wrinkled or peeled off, or such bubbles may even lead to poor touch control. Therefore, how to avoid the occurrence of bubbles is a problem to be solved in the FMLOC process.

SUMMARY

An objective of embodiments of the present disclosure is to provide a manufacturing method for manufacturing a display panel, a display panel and a display device so as to overcome the deficiencies in related art.

According to an aspect of the present disclosure, there is provided a manufacturing method for manufacturing a display panel, the display panel including a display area and a peripheral area surrounding the display area. The manufacturing method includes:

providing a driving backplane;

forming an inorganic encapsulation layer on the driving backplane using a vapor deposition method, so that the inorganic encapsulation layer includes a main encapsulation layer which covers the display area and a part of the peripheral area and an infiltration layer which extends from the main encapsulation layer towards a direction away from the display area;

forming an inorganic layer on a side of the inorganic encapsulation layer away from the driving backplane, so that the inorganic layer includes a first inorganic layer which covers the main encapsulation layer and a second inorganic layer which extends from the first inorganic layer towards the direction away from the display area; and simultaneously etching the second inorganic layer and the infiltration layer using a same mask to remove the second inorganic layer and the infiltration layer.

In an example embodiment of the present disclosure, the inorganic layer is a buffer layer in a touch function layer:

forming the inorganic layer includes:

forming the buffer layer on a side of the inorganic encapsulation layer away from the driving backplane, so that the buffer layer includes a first buffer layer which covers the main encapsulation layer and a second buffer layer which extends from the first buffer layer towards the direction away from the display area, wherein the first buffer layer is the first inorganic layer, and the second buffer layer is the second inorganic layer:

etching of the second inorganic layer and the infiltration layer includes:

simultaneously etching the second buffer layer and the infiltration layer using the same mask to remove the second buffer layer and the infiltration layer.

In an example embodiment of the present disclosure, the inorganic layer is a touch insulating layer in the touch functional layer;

forming the inorganic layer includes:

forming the touch insulating layer on a side of the inorganic encapsulation layer away from the driving backplane, so that the touch insulating layer includes a first insulating layer which covers the main encapsulation layer and a second insulating layer which extends from the first insulating layer towards the direction away from the display area, wherein the first insulating layer is the first inorganic layer, and the second insulating layer is the second inorganic layer;

etching of the second inorganic layer and the infiltration layer includes:

simultaneously etching the second insulating layer and the infiltration layer using the same mask to remove the second insulating layer and the infiltration layer;

the manufacturing method further includes:

forming a first touch electrode layer between the inorganic encapsulation layer and the touch insulating layer, so that a projection of the first touch electrode layer on the driving backplane is located within a projection of the main encapsulation layer.

In an example embodiment of the present disclosure, the manufacturing method further includes:

forming a buffer layer between the inorganic encapsulation layer and the first touch electrode layer, so that the buffer layer includes a first buffer layer which covers the main encapsulation layer and a second buffer layer which extends from the first buffer layer towards the direction away from the display area;

when the second insulating layer and the infiltration layer are simultaneously etched and removed using the same mask, the second buffer layer is also etched and removed at the same time.

In an example embodiment of the present disclosure, the manufacturing method further includes:

forming, on the driving backplane, a barrier dam in the peripheral area and surrounding the display area;

wherein when the inorganic encapsulation layer is formed, the main encapsulation layer is made to cover the display area and the barrier dam.

In an example embodiment of the present disclosure, forming the inorganic encapsulation layer includes:

forming a first inorganic encapsulation layer on the driving backplane by the vapor deposition method, wherein the first inorganic encapsulation layer includes a first main encapsulation layer which covers the display area and the barrier dam and a first infiltration layer which extends from the first main encapsulation layer towards the direction away from the display area;

forming a second inorganic encapsulation layer which covers the first inorganic encapsulation layer by the vapor deposition method, wherein the second inorganic encapsulation layer includes a second main encapsulation layer which covers the display area and the barrier dam and a second infiltration layer which extends from the second main encapsulation layer towards the direction away from the display area, the second main encapsulation layer covers the first main encapsulation layer, and the second infiltration layer covers the first infiltration layer;

wherein etching of the infiltration layer to remove the infiltration layer includes simultaneously etching the first infiltration layer and the second infiltration layer to remove the first infiltration layer and the second infiltration layer.

According to a second aspect of the present disclosure, there is provided a display panel. The display panel is divided into a display area and a peripheral area surrounding the display area. The display panel includes:

a driving backplane;

an inorganic encapsulation layer arranged on the driving backplane and covering the display area and a part of the peripheral area; and an inorganic layer arranged on a side of the inorganic encapsulation layer away from the driving backplane, wherein an edge of the inorganic layer and an edge of the inorganic encapsulation layer are flush in a thickness direction of the display panel, and both the edge of the inorganic layer and the edge of the inorganic encapsulation layer are located in the peripheral area.

In an example embodiment of the present disclosure, the inorganic layer is a buffer layer in a touch function layer, and an edge of the buffer layer and the edge of the inorganic encapsulation layer are flush in the thickness direction of the display panel.

In an example embodiment of the present disclosure, the inorganic layer is a touch insulating layer in a touch functional layer, and an edge of the touch insulating layer and the edge of the inorganic encapsulation layer are flush in the thickness direction of the display panel;

the display panel further includes a first touch electrode layer arranged between the inorganic encapsulation layer and the touch insulating layer, and a projection of the first touch electrode layer on the driving backplane is located within a projection of the inorganic encapsulation layer.

In an example embodiment of the present disclosure, the display panel further includes:

a buffer layer in the touch function layer, wherein the buffer layer is arranged between the inorganic encapsulation layer and the first touch electrode layer, and an edge of the buffer layer and edges of the touch insulating layer and the inorganic encapsulation layer are flush in the thickness direction of the display panel.

In an example embodiment of the present disclosure, the display panel further includes:

a barrier dam arranged in the peripheral area and around the display area;

wherein the inorganic encapsulation layer covers the display area and the barrier dam, and the edge of the inorganic layer and the edge of the inorganic encapsulation layer are both located on a side of the barrier dam away from the display area.

In an example embodiment of the present disclosure, the inorganic encapsulation layer includes a first inorganic encapsulation layer and a second inorganic encapsulation layer which are stacked;

the edge of the inorganic layer and edges of the first inorganic encapsulation layer and the second inorganic encapsulation layer are flush in the thickness direction of the display panel.

According to a third aspect of the present disclosure, there is provided a display device including the display panel described above.

It should be understood that the above general description and the following detailed description are only exemplary and explanatory, and should not be construed as constituting any limitation on the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without creative efforts.

FIG. 3 is a flowchart of a method for manufacturing a display panel according to an embodiment of the disclosure.

FIG. 4 is a schematic structural diagram showing sub-pixels in a display area of a display panel according to an embodiment of the disclosure.

DETAILED DESCRIPTION

Figure 1:
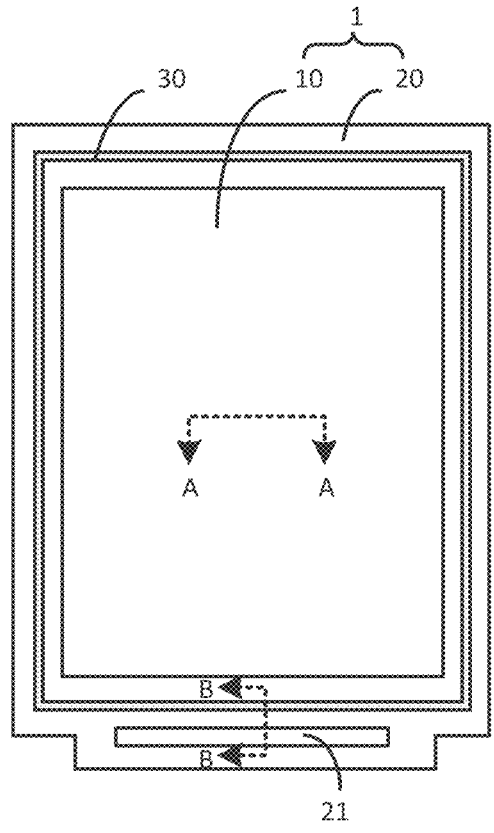
FIG. 1 is a top view of a FMLOC display panel.

Example embodiments will now be described more fully with reference to the accompanying drawings. However, the example embodiments can be implemented in a variety of forms and should not be construed as being limited to the examples set forth herein; rather, these embodiments are provided so that the present disclosure will be more complete so as to convey the idea of the example embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

Although relative terms such as "upper" and "lower" are used herein to describe the relative relationship between one component in the drawings and another component, these terms are used for convenience in description, for example, and are based on the directions of the examples described in the drawings. It can be understood that if a device shown in the drawings is turned upside down, a component described as "upper" will become a "lower" component. When a structure is "on" another structure, it may mean that the certain structure is integrally formed on another structure, or that the structure is "directly" provided on another structure, or that the structure is "indirectly" provided on another structure through other structures.

The terms "a", "an", "said" and "at least one" are used to indicate the presence of one or more elements/components, and so on; the terms "include/comprise" and "have" are open terms and means inclusive, and refers to that in addition to the listed elements/components and so on, there may be other elements/components and so on. The terms "first", "second" and "third" are used as markers and do not constitute any limitation on the number of objects.

FIG. 1 is a top view of a display panel with an FMLOC structure. The display panel includes a display area 10 in the center and a peripheral area 20 surrounding the display area.

A part of the display area is provided with a pixel circuit, an OLED light emitting device is arranged above the pixel circuit, an encapsulation layer is arranged above the OLED light emitting device, and a touch function layer is arranged above the encapsulation layer. A part of the peripheral area 20 is provided with driving circuits, various leads and annular encapsulation structures, etc. The peripheral area 20 also includes a lap area 21 located below the display panel, and the lap area 21 is used to realize the lap between touch electrodes and the leads.

Figure 2:
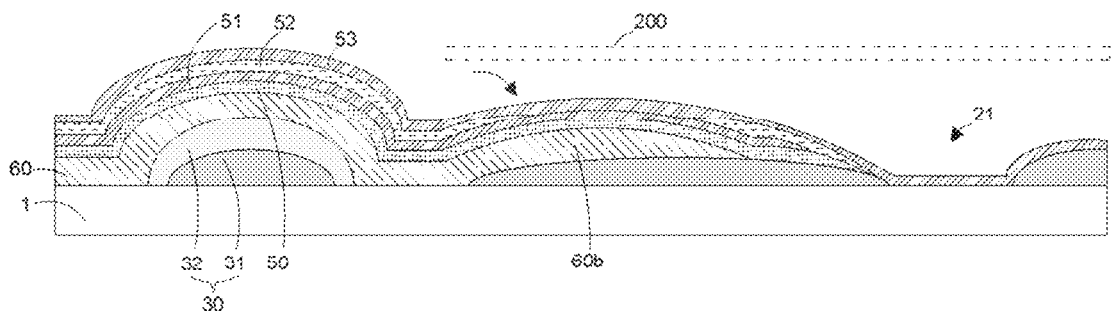
FIG. 2 is a schematic cross-sectional view showing film layers at a position in FIG. 1 where bubbles are likely to occur.

FIG. 2 is a cross-sectional view of a encapsulation structure under the current peripheral area. FIG. 2 is a schematic cross-sectional view along the B-B direction in FIG. 1. The encapsulation structure usually includes one or two annular barrier dams 30 formed by stacking a plurality of film layers and protruding on the driving backplane to block external water and oxygen from invading the display area through the peripheral area, thereby protecting the OLED devices in the display area. An inorganic encapsulation layer 60 in the encapsulation layer has the best blocking effect on water and oxygen, and usually covers the display area 10 and the barrier dams 30 to further prevent the invading of external water and oxygen. A touch functional layer generally includes a buffer layer 50, a first touch electrode layer 51, a second touch electrode layer 53 and a touch insulating layer 52 arranged between the first touch electrode layer 51 and the second touch electrode layer 53. The two touch electrode layers are connected through a via hole in the touch insulating layer 52. The two touch electrode layers usually cover the barrier dams 30 and extend and gather to the lap area 21 outside the barrier dams, so as to be lapped with the leads in the lap area.

The inventor(s) of the present application found that in a display panel with the FMLOC structure, the most likely position where bubbles are easy to occur is the edge of the outer ring of the barrier dam(s) corresponding to the edge of the inorganic encapsulation layer (as indicated by the arrow in the figure). It is found after analysis that the inorganic encapsulation layer 60 is fabricated by a vapor deposition process using a mask 200, the mask 200 and the driving backplane 1 cannot be bonded at zero distance, and thus there must be a little gap, which leads to infiltration of inorganic materials in the vapor phase through the gap, and a thin inorganic film layer (shadow, hereinafter referred to as the infiltration layer 60b) is formed at the edge of the mask. The presence of the infiltration layer 60b here makes it become more difficult for the water vapor in lower organic film layers to discharge, and the water vapor is easy to accumulate here. In addition, the infiltration layer 60b is a by-product of the inorganic encapsulation layer, the thickness of the film layer is relatively thin and the film quality is poor, and thus bubbles are easily formed when the infiltration layer 60b encounters water vapor. For the above reasons, the film layer of the infiltration layer 60b is easily separated due to bubbles, which in turn causes film layers to wrinkle and contaminate equipment, affecting the production yield, and even causing the touch electrode lines to break, and resulting in poor touch control.

In view of the above-mentioned problems, embodiments of the present disclosure provide a manufacturing method for manufacturing a display panel, which can prevent the display panel from forming bubbles at corresponding positions. Referring to FIG. 3, the manufacturing method for manufacturing the display panel according to an embodiment of the present disclosure includes the following steps:

In step S100, the driving backplane 1 is provided.

In step S200, the inorganic encapsulation layer 60 is formed on the driving backplane using a vapor deposition method, so that the inorganic encapsulation layer 60 includes a main encapsulation layer which covers the display area and a part of the peripheral area and an infiltration layer 60b which extends from the main encapsulation layer towards a direction away from the display area.

In step S300, an inorganic layer 5 is formed on a side of the inorganic encapsulation layer 60 away from the driving backplane 1, so that the inorganic layer 5 includes a first inorganic layer which covers the main encapsulation layer and a second inorganic layer which extends from the first inorganic layer towards the direction away from the display area.

In step S400, the second inorganic layer and the infiltration layer are simultaneously etched using the same mask to remove the second inorganic layer and the infiltration layer 60b.

In the embodiment of the present disclosure, the inorganic encapsulation layer formed by the vapor deposition method is divided into the main encapsulation layer and the infiltration layer. The main encapsulation layer is a part located in an opening of the mask during the formation process, that is, a part that normally covers the display area and part of the peripheral area. The infiltration layer 60b is a part (that is, a shadow) formed by infiltration into the gap between the mask and the driving backplane. In the subsequent process of forming the inorganic layer 5, the inorganic layer 5 is also made of an inorganic material, the same mask can be used to etch away both the second inorganic layer and the infiltration layer 60b through the same etching process, thereby removing the shadow, eliminating the problem of bubbles caused by the shadow and ensuring the good performance of the FMLOC touch display panel.

The manufacturing method for manufacturing the display panel according to the embodiment of the present disclosure will be described in detail below.

In step S100, the driving backplane 1 is provided.

FIG. 4 shows a schematic cross-sectional view of the display area. FIG. 4 schematically shows a schematic cross-sectional structure diagram of a sub-pixel. Taking the formation of the display area structure shown in FIG. 4 as an example, a pixel circuit is provided at a position of the driving backplane 1 corresponding to the display area. The pixel circuit includes a driving transistor. Specifically, the driving backplane 1 includes a substrate 100 and a driving transistor located on a side of the substrate 100. For example, the driving transistor includes a buffer layer 90, an active layer 91, a gate insulating layer 92, a gate layer 93, an interlayer insulating layer 94, a source and drain layer 95, a passivation layer 96, a planarization layer 97, and the like. The above-mentioned film layers may be fabricated sequentially from bottom to top, and corresponding patterns are formed through patterning processes. It should be noted that the structure of the driving transistor is not limited to this, and may be determined according to actual requirements. The driving backplane 1 is provided with a driving circuit and various leads at a position corresponding to the peripheral area. The leads and the like in the peripheral area may be formed by synchronous patterning processes using the same materials as the source and drain layers, or the gate layer or other film layers in the display area, so as to simplify the manufacturing method. The driving backplane 1 may be prepared by existing preparation processes.

An OLED light emitting device is further fabricated on the driving backplane 1. Referring again to FIG. 4, a first electrode layer 80 is formed on the planarization layer 97, and the first electrode layer 80 is electrically connected to the drain of the driving transistor through a via hole. Then, a pixel defining layer 81 having an opening is formed. The opening of the pixel defining layer 81 exposes the first electrode layer 80. Then, an organic light-emitting functional layer 82 and a second electrode layer 83 covering the organic light-emitting functional layer 82 are formed in the opening area. The formed light-emitting device can emit light under the driving of the driving transistor. The OLED light emitting device can also be prepared by existing preparation processes.

Figure 5:
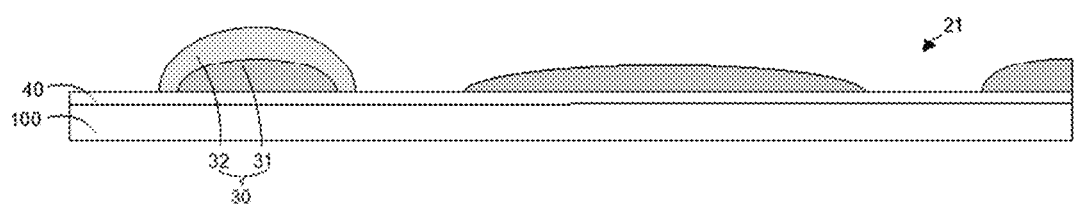
FIG. 5 is a schematic structural diagram of forming a barrier dam in a peripheral area according to an embodiment of the present disclosure.

In the step, a barrier dam 30 surrounding the display area is also formed in the peripheral area on the driving backplane. Taking the barrier dam structure shown in FIG. 5 as an example, the barrier dam 30 includes two layers from bottom to top, that is, a first barrier layer 31 and a second barrier layer 32. The two film layers of the barrier dam and the film layers in the display area may be formed through synchronous processes, thereby simplifying the manufacturing processes. For example, when the planarization layer 97 in the display area is formed, the material of the planarization layer may also be covered in the peripheral area, and the peripheral area is also patterned when the planarization layer 97 in the display area is patterned. That is, trenches are formed on both sides of the planarization layer where the barrier dam is to be formed, and the planarization layer remaining in the middle of the two trenches is the first barrier layer 31 of the barrier dam. Similarly, when forming the pixel defining layer 81 in the display area, the peripheral area is covered with the same material, and the display area and the peripheral area are patterned through the same patterning process to form the second barrier layer 32 on the first barrier layer 31. Since the planarization layer 97 and the pixel defining layer 81 have a larger thicknesses, that is, the first barrier layer 31 and the second barrier layer 32 have a larger thicknesses, the barrier dam 30 has a better blocking effect.

It should be noted that the barrier dam 30 may further include other film layers to further increase the thickness. For example, a conductive film layer (such as an anode) is formed between the first barrier layer 31 and the second barrier layer 32 by using the same material as the first electrode layer 80, which can not only increase the thickness of the barrier dam, but also lead to the lap area as a signal line to be lapped with the leads. On the other hand, the barrier dam 30 is not limited to one, but there may be two or more barrier dams 30.

In step S200, an encapsulation layer is formed on the light emitting device. The forming of the encapsulation layer includes: forming the inorganic encapsulation layer 60 on the driving backplane by the vapor deposition method, so that the inorganic encapsulation layer 60 includes the main encapsulation layer which covers the display area 10 and a part of the peripheral area 20 and an infiltration layer which extends from the main encapsulation layer towards a direction away from the display area.

Figure 6:
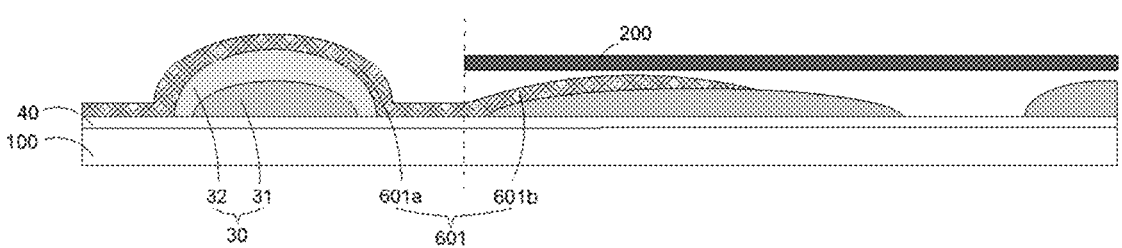
FIG. 6 is a schematic structural diagram of forming a first inorganic encapsulation layer in the peripheral area according to an embodiment of the present disclosure.
Figure 7:
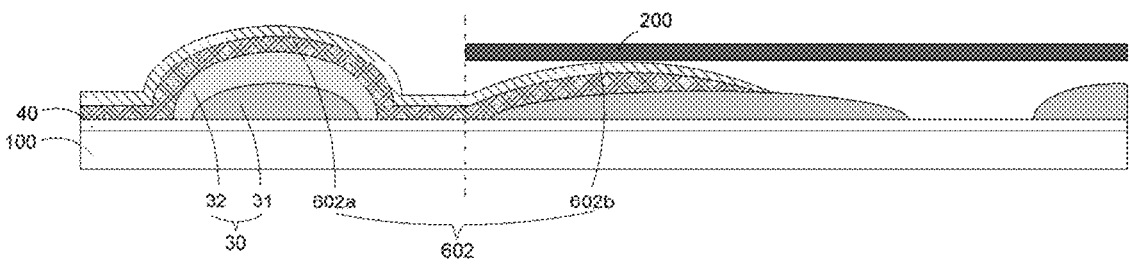
FIG. 7 is a schematic structural diagram of forming a second inorganic encapsulation layer in the peripheral area according to an embodiment of the present disclosure.

Referring to FIG. 4, FIG. 6 and FIG. 7, in this step, the encapsulation layer includes a first inorganic encapsulation layer 601, an organic encapsulation layer 61 and a second inorganic encapsulation layer 602 which are sequentially prepared from bottom to top. The two inorganic encapsulation layers play a major role in blocking the intrusion of water and oxygen, and can be made of inorganic materials such as nitrides, oxides, nitrogen oxides, nitrates, carbides or any combination thereof. The organic encapsulation layer 61 plays a role of auxiliary encapsulation and planarization. The organic encapsulation layer 61 may be made of materials such as acrylic fiber, hexamethyldisiloxane, polyacrylate, polycarbonate, polystyrene and the like.

In this embodiment, the two inorganic encapsulation layers both cover the display area 10 and the barrier dam 30, which means that both the inorganic encapsulation layers extend from the display area 10 to the barrier dam 30 and cover the barrier dam 30, that is, the edges of the two inorganic encapsulation layers are located at a side of the barrier dam 30 away from the display area (right side in the figure). When there are multiple barrier dams 30, the two inorganic encapsulation layers extend all the way to cover the outermost barrier dam 30, and a convex surface is also formed at the position of the barrier dam 30. The organic encapsulation layer 61 usually ends at the barrier dam, and may be formed by exposure and development.

As shown in the figure, both the two inorganic encapsulation layers are formed by vapor chemical deposition using the mask 200. Therefore, both the inorganic encapsulation layers will form a thin layer of shadow on the edge of the mask 200 during the formation process. In the present disclosure, a part of the first inorganic encapsulation layer 601 covering the display area 10 and the barrier dam 30 is defined as the first main encapsulation layer 601a, and a part of the first inorganic encapsulation layer 601 extending from the first main encapsulation layer 601a towards a direction away from the display area is defined as the first infiltration layer 601b. A part of the second inorganic encapsulation layer 602 covering the display area and the barrier dam is defined as the second main encapsulation layer 602a, and a part of the second inorganic encapsulation layer 602 extending from the second main encapsulation layer 602a towards a direction away from the display area is defined as the second infiltration layer 602b. The second main encapsulation layer 602a covers the first main encapsulation layer 601a, and the second infiltration layer 602b covers the first infiltration layer 601b. According to the definition of the present disclosure, the boundaries of the first main encapsulation layer 601a and the second main encapsulation layer 602a coincide, the boundaries of the first infiltration layer 601b and the second infiltration layer 602b close to the display area coincide and are the boundaries of the first main encapsulation layer 601a and the second main encapsulation layer 602a. The boundaries of the first infiltration layer 601b and the second infiltration layer 602b away from the display area may coincide with each other or not. It should be noted that the dotted line shown in the figure indicates that the first main encapsulation layer 601a and the first infiltration layer 601b are divided here, and this position is only a schematic illustration. In fact, the ideal boundary of the inorganic encapsulation layer can be the division position.

In steps S300 to S400, the inorganic layer 5 is formed on a side of the inorganic encapsulation layer 60 away from the driving backplane 1, so that the inorganic layer 5 includes a first inorganic layer covering the main encapsulation layer and a second inorganic layer extending from the first inorganic layer towards a direction away from the display area. The second inorganic layer and the infiltration layer 60b are removed by simultaneous etching using the same mask. The two steps have different preparation processes due to different inorganic layers.

In a first implementation, the inorganic layer 5 is a buffer layer 50 in the touch functional layer, for preventing the conductive material of the upper touch electrode layer from infiltrating downward during the evaporation or sputtering processes. Using the same mask, both the outer side of the barrier dam and the infiltration layer 60b are etched away through the same etching process, so that the shadow can be removed.

Figure 8:
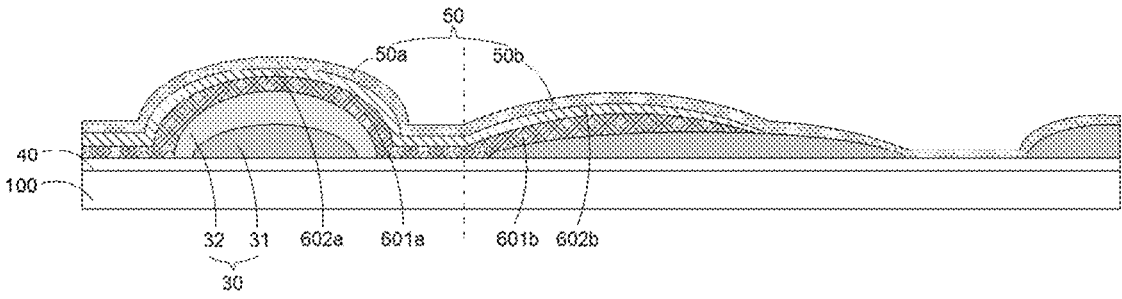
FIG. 8 is a schematic structural diagram of forming a buffer layer in the peripheral area according to a first implementation.

Therefore, in step S300, referring to FIG. 8, the buffer layer 50 is entirely covered on the driving backplane 1 by the vapor chemical deposition method. That is, the buffer layer

50 includes a first buffer layer 50a covering the second main encapsulation layer 602a and a second buffer layer 50b which extends from the first buffer layer 50a towards the direction away from the display area. The second buffer layer 50b covers the display area and the barrier dam, and the boundary of the second buffer layer 50b coincide with the boundaries of the first main encapsulation layer 601a and the second main encapsulation layer 602a. The second buffer layer 50b covers other areas of the display panel. In this implementation, the first inorganic layer is the first buffer layer 50a, and the second inorganic layer is the second buffer layer 50b.

Figure 9:
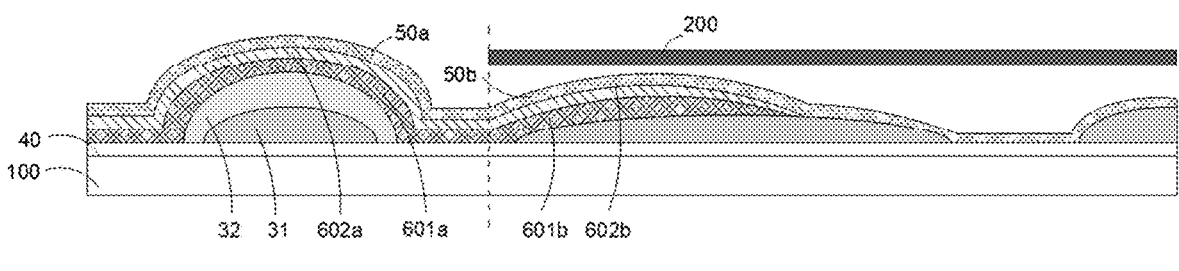
FIG. 9 is a schematic diagram showing the position of a mask in the first implementation.
Figure 10:
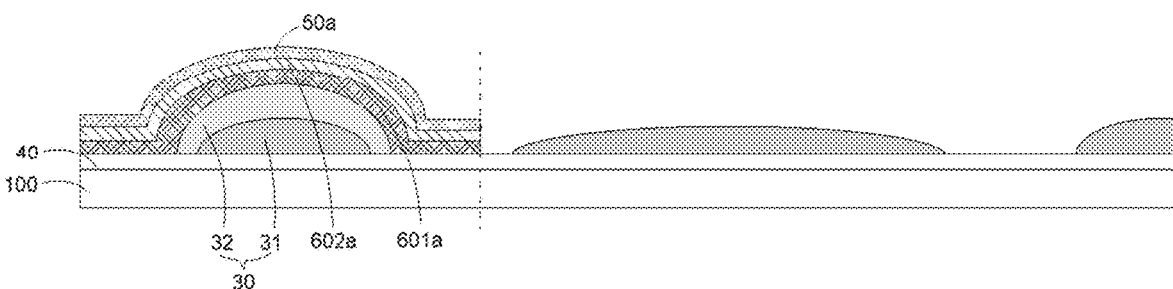
FIG. 10 is a schematic structural diagram of the first implementation after removing the infiltration layer by etching.

In step S400, referring to FIG. 9 and FIG. 10, the second buffer layer 50b is removed by etching using the mask 200, so as to expose the leads covering other areas such as the lap area. Since both the buffer layer 50 and the two inorganic encapsulation layers are made of inorganic materials, the same mask 200 can be used in the etching process to control the etching parameters (such as time, etc.), so that the first infiltration layer 601b and the second infiltration layer 602b are etched away together, thereby achieving the purpose of removing the shadow and simplifying the processes.

Figure 11:
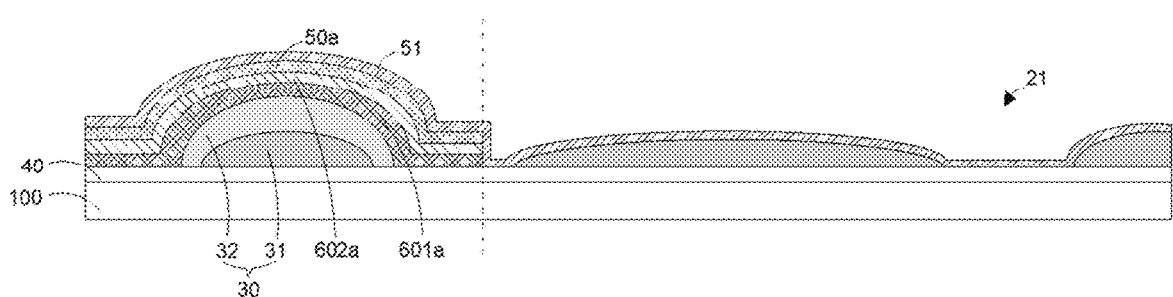
FIG. 11 is a schematic structural diagram of forming a first touch electrode layer in the peripheral area according to the first implementation.
Figure 12:
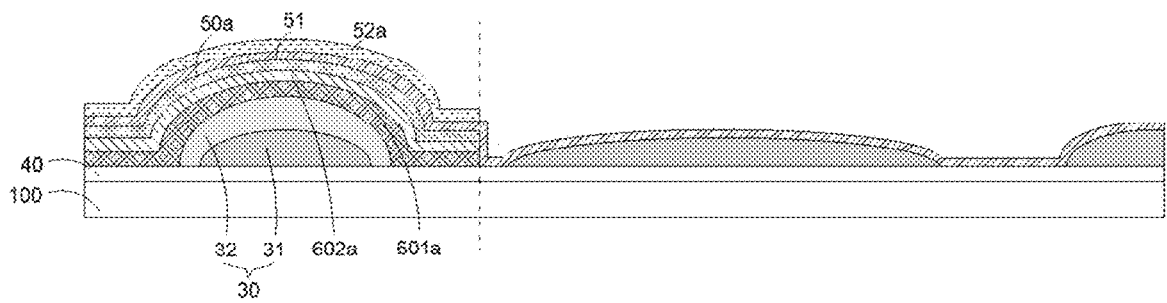
FIG. 12 is a schematic structural diagram of forming a touch insulating layer in the peripheral area according to the first implementation.
Figure 13:
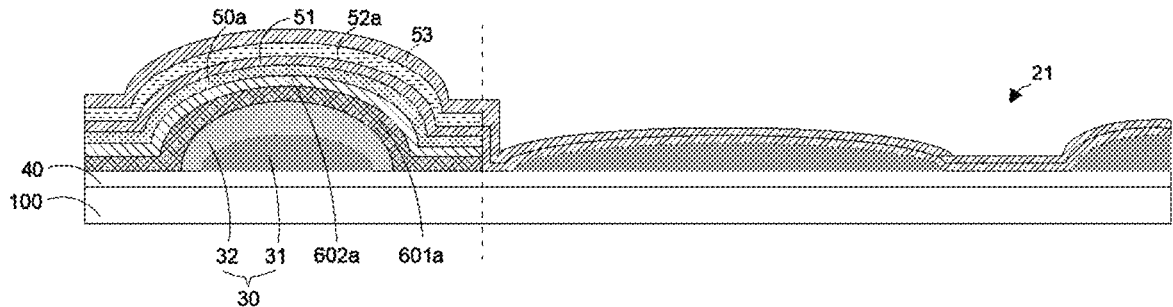
FIG. 13 is a schematic structural diagram of forming a second touch electrode layer in the peripheral area according to the first implementation.

On this basis, referring to FIGS. 11 to 13, the manufacturing method may further include step S500: further forming a first touch electrode layer 51, a touch insulating layer 52 and a second touch electrode layer 53 on the remaining first buffer layer 50a, and the first touch electrode layer 51 and the second touch electrode layer 53 are electrically connected through via holes. Moreover, the first touch electrode layer 51 and the second touch electrode layer 53 both cover the display area and the barrier dam, and extend to the lap area 21 to be lapped with the leads 40 to achieve double-layer lap. In this implementation, the leads 40 and the source and drain layers in the display area can be formed using the same material through a synchronous patterning process.

In a second implementation, the inorganic layer 5 is the touch insulating layer 52 in the touch functional layer. Since the touch insulating layer 52 is also made of inorganic materials, and the touch insulating layer 52 is formed on the driving backplane on its entire surface, the same mask can be used to remove the touch insulating layer 52 outside the barrier dam as well as the infiltration layer 60b by the same etching process, so as to remove the shadow.

Figure 14:
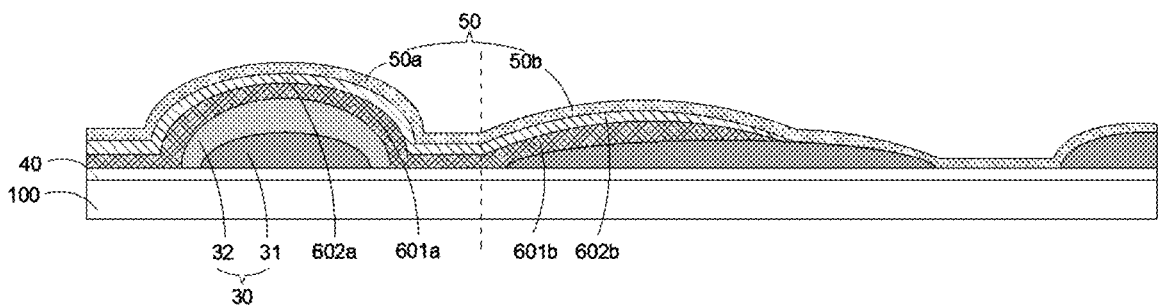
FIG. 14 is a schematic structural diagram of forming a buffer layer in the peripheral area according to a second implementation.

Since other film layers (such as the buffer layer 50 and the first touch electrode layer 51) are also included between the inorganic encapsulation layer 60 and the touch functional layer, steps S300 to S400 may be specifically implemented according to the following steps:

In step S300, referring to FIG. 14, the buffer layer 50 covering the second inorganic encapsulation layer 602 is formed first. The buffer layer 50 can be entirely covered on the driving backplane 1 by vapor chemical deposition. That is, the buffer layer 50 includes a first buffer layer 50a covering the second main encapsulation layer 602a and a second buffer layer 50b extending from the first buffer layer 50a towards a direction away from the display area. The second buffer layer 50b covers the display area and the barrier dam 30. The boundary of the second buffer layer 50b coincides with the boundaries of the first main encapsulation layer 601a and the second main encapsulation layer 602a. The second buffer layer 50b covers the other areas of the display panel.

Figure 15:
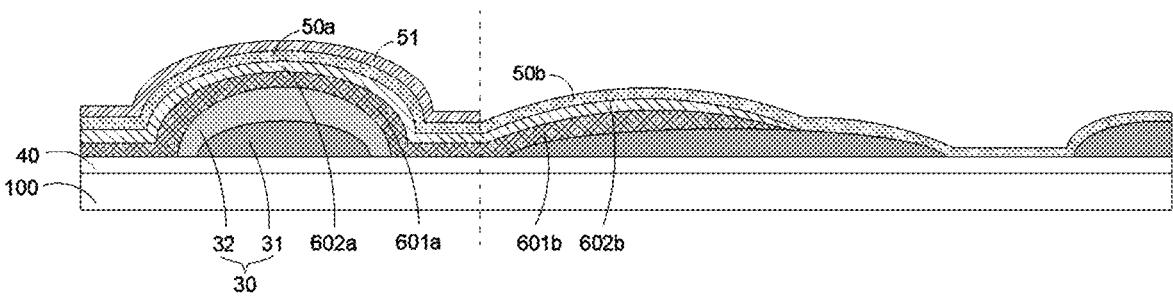
FIG. 15 is a schematic structural diagram of forming a first touch electrode layer in the peripheral area according to the second implementation.

Referring to FIG. 15, the first touch electrode layer 51 is formed on the buffer layer 50, so that a projection of the first touch electrode layer 51 on the driving backplane 1 is within a projection of the main encapsulation layer. The first touch electrode layer 51 may be formed by processes such as magnetron sputtering, vapor deposition, and the like. In this step, the projection of the first touch electrode layer 51 on the driving backplane needs to be located within the projection of the main encapsulation layer. That is, the boundary of the first touch electrode layer 51 is flush with the boundaries of the first main encapsulation layer 601*a*, the second main encapsulation layers 602*a* and the first buffer layer 50*a*, or the boundary of the first touch electrode layer 51 may be closer to the display area than the boundaries of the first main encapsulation layer 601*a*, the second main encapsulation layer 602*a* and the first buffer layer 50*a*. The boundary of the first touch electrode layer 51 is controlled because the electrode layer is usually made of a metal material, unlike the etching gas for inorganic materials, the boundary is limited in the main encapsulation layer so as not to affect the subsequent etching of the infiltration layer 60*b*.

Figure 16:
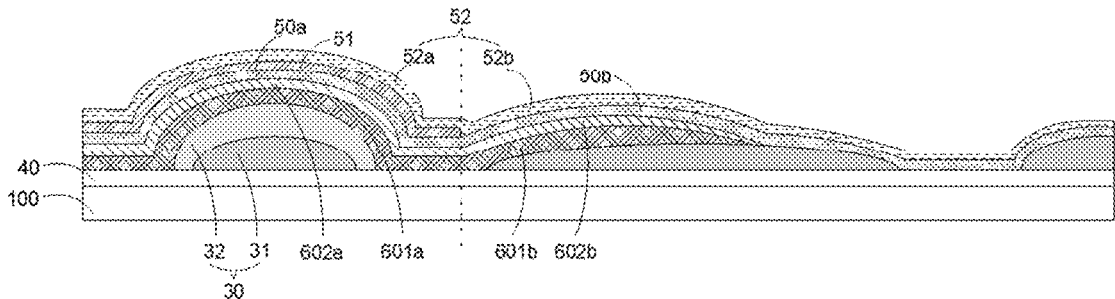
FIG. 16 is a schematic structural diagram of forming a touch insulating layer in the peripheral area according to the second implementation.

Referring to FIG. 16, the touch insulating layer 52 is formed on a side of the first touch electrode layer 51 away from the buffer layer 50, so that the touch insulating layer 52 includes a first insulating layer 52*a* covering the second main encapsulation layer 602*a* and a second insulating layer 52*b* extending from the first insulating layer 52*a* towards a direction away from the display area. The touch insulating layer 52 is formed on the driving backplane 1 on its entire surface using inorganic insulating materials through the vapor chemical deposition method. That is to say, the first insulating layer 52*a* covers the display area and the barrier dam, and its boundary coincides with the boundaries of the first main encapsulation layer 601*a*, the second main encapsulation layer 602*a* and the first buffer layer 50*a*. The second insulating layer 52*b* covers other areas of the display panel. In this implementation, the first inorganic layer is the first insulating layer 52*a*, and the second inorganic layer is the second insulating layer 52*b*.

Figure 17:
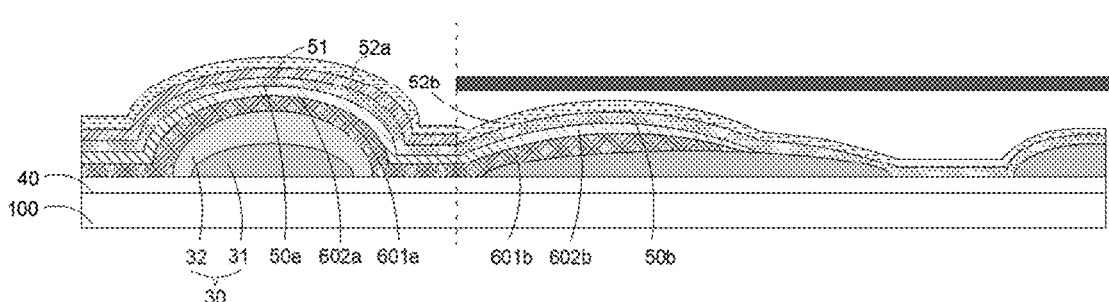
FIG. 17 is a schematic diagram showing the position of the mask of the second implementation.
Figure 18:
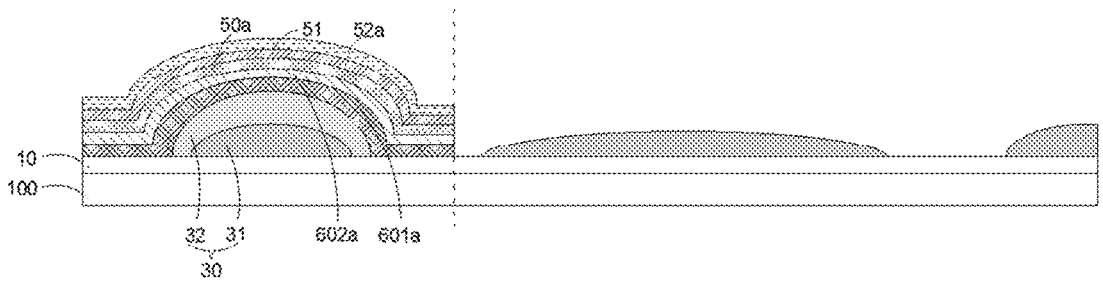
FIG. 18 is a schematic structural diagram of the second implementation after removing the infiltration layer by etching.

Referring to FIG. 17 and FIG. 18, in step S400, the second insulating layer 52*b* and the infiltration layer 60*b* are removed by simultaneous etching using the same mask 200.

Since the touch insulating layer 52 and the buffer layer 50 are formed on the entire surface without using a mask during the formation process, the second insulating layer 52*b* and the second buffer layer 50*b* need to be removed by etching using the mask 200 in this step, to expose the leads covering other areas such as the lap area. Since the touch insulating layer 52, the buffer layer 50 and the two inorganic encapsulation layers are all made of inorganic materials, during the etching process, the etching parameters (such as time, etc.) can be controlled to make the second insulating layer 52*b*, the first infiltration layer 601*b*, the second infiltration layer 602*b*, and the second buffer layer 50*b* etched away together. Since the boundary of the first touch electrode layer 51 does not exceed the boundary of the main encapsulation layer, the first touch electrode layer 51 does not hinder the etching of the infiltration layer and the second buffer layer 50*b*. In addition, because the gas for etching an inorganic material is different from the gas for etching the metal material, the portion of the first touch electrode layer 51 located in the display area will not be affected. In addition, compared with the previous implementation in which the etching is performed when the buffer layer 50 is fabricated, this method requires one less mask process, which simplifies the entire fabrication process.

Alternatively, in this implementation, the buffer layer 50 may be omitted, and the first touch electrode layer 51 may be directly fabricated on the encapsulation layer, and the second insulating layer 52*b*, the first infiltration layer 601*b*, and the second infiltration layer 602*b* may be etched away using the above described method.

Figure 19:
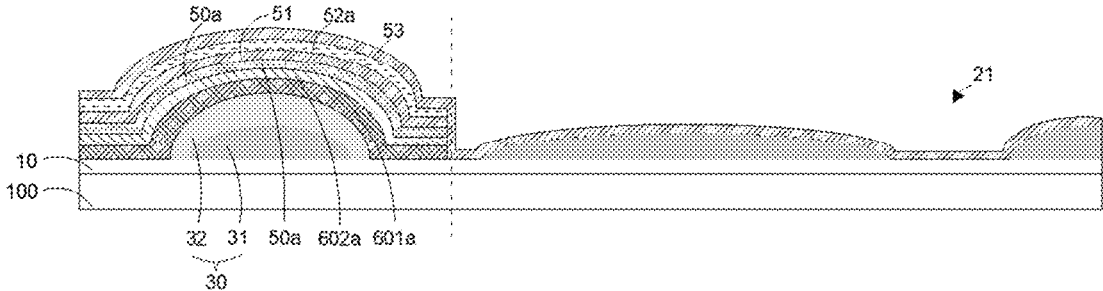
FIG. 19 is a schematic structural diagram of forming a second touch electrode layer in the peripheral area according to the second implementation.

On this basis, referring to FIG. 19, the manufacturing method may further include step S500: forming the second touch electrode layer 53 on a side of the touch insulating layer 52 away from the first touch electrode layer 51, so that the second touch electrode layer 53 covers the touch insulating layer 52 and extends to the lap area 21 so as to be lapped with the leads 40 in the lap area 21. In this implementation, the leads 40 and the source and drain layers in the display area can formed through synchronous patterning process using the same material. Since the boundary of the first touch electrode layer 51 is limited within the main encapsulation layer, the lap joint is a single-layer lap. The formation method of the second touch electrode layer 53 is the same as that of the first touch electrode layer 51, and details are not repeated here.

It should be noted that the above manufacturing method omits the preparation of part of the film layers in the display area, and those skilled in the art can understand that these film layers can be completely prepared by existing preparation processes. In addition, the above-mentioned step numbers do not constitute a limitation on the preparation sequence, and other process sequences can be used to manufacture the display panel in embodiments of the present disclosure without departing from the idea of the present disclosure.

Figure 20:
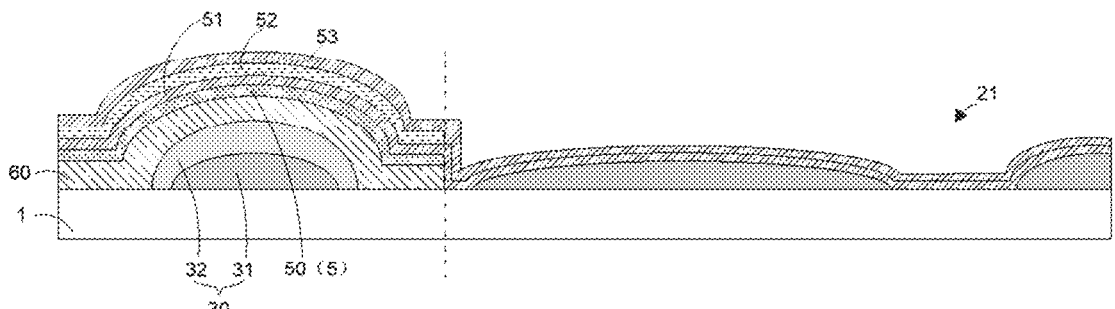
FIG. 20 is a schematic structural diagram of a display panel according to the first implementation.
Figure 21:
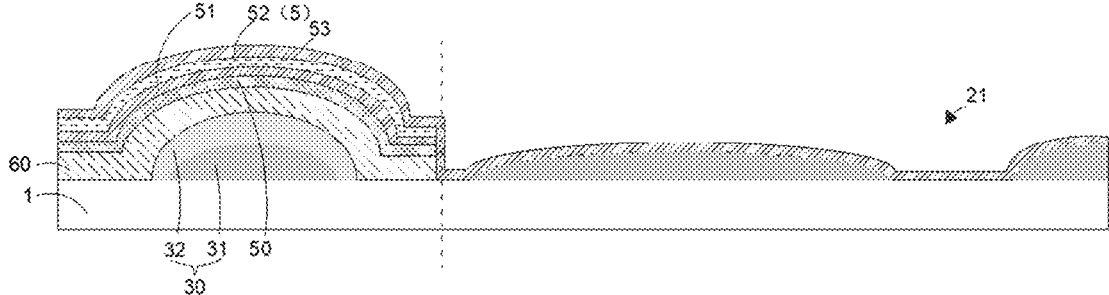
FIG. 21 is a schematic structural diagram of a display panel according to the second implementation.

Embodiments of the present disclosure also provide a display panel prepared by the above-mentioned manufacturing methods. FIG. 20 and FIG. 21 are schematic cross-sectional views along the direction B-B in FIG. 1. With reference to FIG. 1, FIG. 20 and FIG. 21, the display panel is divided into the display area 10 and the peripheral area 20 surrounding the display area. The display panel includes the driving backplane 1, the inorganic encapsulation layer 60 and the inorganic layer 5. The inorganic encapsulation layer is provided on the driving backplane 1 and covers the display area 10 and a part of the peripheral area. The inorganic layer 5 is arranged on a side of the inorganic encapsulation layer 60 away from the driving backplane 1, and an edge of the inorganic layer 5 is flush with an edge of the inorganic encapsulation layer 60 in the thickness direction of the display panel, i.e., both are located in the peripheral area 20. Corresponding to the above manufacturing methods, the inorganic layer 5 in the display panel is the first inorganic layer, and the inorganic encapsulation layer 60 is the main encapsulation layer 60*a*.

In an embodiment, the display panel is prepared by the manufacturing method shown in FIGS. 5 to 13, and the inorganic layer 5 is the buffer layer 50 in the touch functional layer. FIG. 20 is a partial cross-sectional view of the display panel. The buffer layer 50 and the inorganic encapsulation layer 60 both cover the display area and the barrier dam 30, and the edge of the buffer layer 50 and the edge of the inorganic encapsulation layer 60 are flush in the thickness direction of the display panel, that is, on the outside of the barrier dam 30. The buffer layer 50 is the first buffer layer 50*a*.

Further, the display panel further includes the first touch electrode layer 51, the touch insulating layer 52 and the second touch electrode layer 53 arranged on the buffer layer 50. The first touch electrode layer 51 and the second touch electrode layer 53 are electrically connected through via holes. Moreover, the first touch electrode layer 51 and the second touch electrode layer 53 both cover the display area and the barrier dam, and extend to the lap area for lap, so as to realize double-layer lap.

In another embodiment, the display panel is prepared by the manufacturing method shown in FIGS. 14 to 19, and the inorganic layer 5 is the touch insulating layer 52 in the touch functional layer. FIG. 21 is a partial cross-sectional view of the display panel. The touch insulating layer 52 and the inorganic encapsulation layer 60 both cover the display area and the barrier dam 30, and the edge of the touch insulating layer 52 and the edge of the inorganic encapsulation layer 60 are flush in the thickness direction of the display panel, i.e., on the outside of the barrier dam 30. The touch insulating layer 52 is the first insulating layer 52a.

Specifically, the first touch electrode layer 51 is further included between the inorganic encapsulation layer 60 and the touch insulating layer 52. The projection of the first touch electrode layer 51 on the driving backplane 1 is located within the projection of the inorganic encapsulation layer 60. The second touch electrode layer 53 is further disposed on the touch insulating layer 52. The second touch electrode layer 53 covers the touch insulating layer 52 and extends to the lap area 21 to be lapped with the leads in the lap area 21. In this embodiment, a single-layer lap is formed. The second touch electrode layer 53 and the first touch electrode layer 51 are electrically connected through via holes provided in the touch insulating layer 52.

Further, the display panel may further include the buffer layer 50 arranged between the encapsulation layer and the first touch electrode layer 51. Since the simultaneous etching method is adopted in this embodiment, the edge of the buffer layer 50 is flush with the edges of the touch insulating layer 52 and the inorganic encapsulation layer 60 in the thickness direction of the display panel.

In an embodiment, referring to FIGS. 20 and 21, the touch insulating layer 52, the buffer layer 50 and the inorganic encapsulation layer 60 all cover the display area and the annular barrier dam 30 disposed in the peripheral area, namely the edges of the touch insulating layer 52 and the inorganic encapsulation layer is located on a side of the barrier dam away from the display area. The number of barrier dams 30 may be more than one. When multiple barrier dams are included, the touch insulating layer 52 and the inorganic encapsulation layer extend all the way to cover the outermost barrier dam, because during the preparation process, a portion of the touch insulating layer 52 and the inorganic encapsulation layer outside the outermost barrier dam is etched away. Correspondingly, the boundary of the first touch electrode layer 51 also does not exceed the outermost barrier dam.

In an embodiment, the encapsulation layer includes three stacked film layers: the first inorganic encapsulation layer 601, the organic encapsulation layer 61 and the second inorganic encapsulation layer 602 that are sequentially prepared from bottom to top. The organic encapsulation layer 61 ends at the innermost barrier dam, and the first inorganic encapsulation layer 601 and the second inorganic encapsulation layer 602 cover the barrier dams 30. Since a portion of the touch insulating layer 52 and the inorganic encapsulation layer 60 in the peripheral area is etched away together during the preparation process, the edges of the finally formed touch insulating layer 52 and the inorganic encapsulation layer 60 are flush in the thickness direction of the panel.

An embodiment of the present disclosure further provides a display device including the display panel of the above-mentioned embodiments. Since the display device includes the above-mentioned display panel, it has the same beneficial effects, and details are not described here in the present disclosure.

The present disclosure does not specifically limit the application of display devices, which can be any product or members having a flexible display function, such as, TV, notebook computer, tablet computer, wearable display device, mobile phone, in-vehicle display, navigation device, e-book, digital photo frame, advertising light box, and so on.

It should be noted that although various steps of the methods in the present disclosure are described in a specific order in the drawings, this does not require or imply that the steps must be performed in the specific order, or that all the illustrated steps must be performed to achieve desired result. Additionally or alternatively, certain steps may be omitted, multiple steps may be combined into one step, and/or one step may be decomposed into multiple steps, and so on.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are only regarded as exemplary, and the true scope and spirit of the present disclosure are defined by the appended claims.

What is claimed is:

1. A manufacturing method for manufacturing a display panel, the display panel comprising a display area and a peripheral area surrounding the display area, wherein the manufacturing method comprises:

providing a driving backplane;

forming an inorganic encapsulation layer on the driving backplane by a mask using a vapor deposition method, so that the inorganic encapsulation layer comprises a main encapsulation layer which covers the display area and a part of the peripheral area and an infiltration layer which extends from the main encapsulation layer towards a direction away from the display area, wherein the infiltration layer is formed by infiltrating of an inorganic material, which is used for forming the main encapsulation layer, between the mask and the driving backplane, and a part of the inorganic encapsulation layer covering the display area and a barrier dam is the main encapsulation layer;

forming an inorganic layer on a side of the inorganic encapsulation layer away from the driving backplane, so that the inorganic layer comprises a first inorganic layer which covers the main encapsulation layer and a second inorganic layer which extends from the first inorganic layer towards the direction away from the display area; and simultaneously etching the second inorganic layer and the infiltration layer using a same mask to remove the second inorganic layer and the infiltration layer at an outside of the barrier dam.

2. The manufacturing method for manufacturing the display panel according to claim 1, wherein the inorganic layer is a buffer layer in a touch function layer;

wherein forming the inorganic layer comprises:

forming the buffer layer on a side of the inorganic encapsulation layer away from the driving backplane, so that the buffer layer comprises a first buffer layer which covers the main encapsulation layer and a second buffer layer which extends from the first buffer layer towards the direction away from the display area, wherein the first buffer layer is the first inorganic layer, and the second buffer layer is the second inorganic layer;

wherein etching of the second inorganic layer and the infiltration layer comprises:

simultaneously etching the second buffer layer and the infiltration layer using the same mask to remove the second buffer layer and the infiltration layer.

3. The manufacturing method for manufacturing the display panel according to claim 1, wherein the inorganic layer is a touch insulating layer in the touch functional layer;

wherein forming the inorganic layer comprises:

forming the touch insulating layer on a side of the inorganic encapsulation layer away from the driving backplane, so that the touch insulating layer comprises a first insulating layer which covers the main encapsulation layer and a second insulating layer which extends from the first insulating layer towards the direction away from the display area, wherein the first insulating layer is the first inorganic layer, and the second insulating layer is the second inorganic layer;

wherein etching of the second inorganic layer and the infiltration layer comprises:

simultaneously etching the second insulating layer and the infiltration layer using the same mask to remove the second insulating layer and the infiltration layer;

wherein the manufacturing method further comprises:

forming a first touch electrode layer between the inorganic encapsulation layer and the touch insulating layer, so that a projection of the first touch electrode layer on the driving backplane is located within a projection of the main encapsulation layer.

4. The manufacturing method for manufacturing the display panel according to claim 3, further comprising:

forming a buffer layer between the inorganic encapsulation layer and the first touch electrode layer, so that the buffer layer comprises a first buffer layer which covers the main encapsulation layer and a second buffer layer which extends from the first buffer layer towards the direction away from the display area;

wherein when the second insulating layer and the infiltration layer are simultaneously etched and removed using the same mask, the second buffer layer is also etched and removed at the same time.

5. The manufacturing method for manufacturing the display panel according to claim 1, further comprising:

forming, on the driving backplane, the barrier dam in the peripheral area and surrounding the display area;

wherein when the inorganic encapsulation layer is formed, the main encapsulation layer is made to cover the display area and the barrier dam.

6. The manufacturing method for manufacturing the display panel according to claim 1, wherein forming the inorganic encapsulation layer comprises:

forming a first inorganic encapsulation layer on the driving backplane by the vapor deposition method, wherein the first inorganic encapsulation layer comprises a first main encapsulation layer which covers the display area and the barrier dam and a first infiltration layer which extends from the first main encapsulation layer towards the direction away from the display area;

forming a second inorganic encapsulation layer which covers the first inorganic encapsulation layer by the vapor deposition method, wherein the second inorganic encapsulation layer comprises a second main encapsulation layer which covers the display area and the barrier dam and a second infiltration layer which extends from the second main encapsulation layer towards the direction away from the display area, the second main encapsulation layer covers the first main encapsulation layer, and the second infiltration layer covers the first infiltration layer;

wherein etching of the infiltration layer to remove the infiltration layer comprises simultaneously etching the first infiltration layer and the second infiltration layer to remove the first infiltration layer and the second infiltration layer.

7. A display panel, wherein the display panel is divided into a display area and a peripheral area surrounding the display area, and the display panel comprises:

a driving backplane;

an inorganic encapsulation layer arranged on the driving backplane and covering the display area and a part of the peripheral area, wherein the inorganic encapsulation layer is formed on the driving backplane by a mask using a vapor deposition method, so that the inorganic encapsulation layer comprises a main encapsulation layer which covers the display area and a part of the peripheral area and an infiltration layer which extends from the main encapsulation layer towards a direction away from the display area; and an inorganic layer arranged on a side of the inorganic encapsulation layer away from the driving backplane, wherein an edge of the inorganic layer and an edge of the inorganic encapsulation layer are flush in a thickness direction of the display panel, and both the edge of the inorganic layer and the edge of the inorganic encapsulation layer are located in the peripheral area;

wherein the infiltration layer which is formed by infiltrating of an inorganic material, which is used for forming the main encapsulation layer, between the mask and the driving backplane and is at an outside of a barrier dam in the display panel, is removed.

8. The display panel according to claim 7, wherein the inorganic layer is a buffer layer in a touch function layer, and an edge of the buffer layer and the edge of the inorganic encapsulation layer are flush in the thickness direction of the display panel.

9. The display panel according to claim 7, wherein the inorganic layer is a touch insulating layer in a touch functional layer, and an edge of the touch insulating layer and the edge of the inorganic encapsulation layer are flush in the thickness direction of the display panel;

wherein the display panel further comprises a first touch electrode layer arranged between the inorganic encapsulation layer and the touch insulating layer, and a projection of the first touch electrode layer on the driving backplane is located within a projection of the inorganic encapsulation layer.

10. The display panel according to claim 9, further comprising:

a buffer layer in the touch function layer, wherein the buffer layer is arranged between the inorganic encapsulation layer and the first touch electrode layer, and an edge of the buffer layer and edges of the touch insulating layer and the inorganic encapsulation layer are flush in the thickness direction of the display panel.

11. The display panel according to claim 7, further comprising:

the barrier dam arranged in the peripheral area and around the display area;

wherein the inorganic encapsulation layer covers the display area and the barrier dam, and the edge of the inorganic layer and the edge of the inorganic encapsulation layer are both located on a side of the barrier dam away from the display area.

12. The display panel according to claim 7, wherein the inorganic encapsulation layer comprises a first inorganic encapsulation layer and a second inorganic encapsulation layer which are stacked;

wherein the edge of the inorganic layer and edges of the first inorganic encapsulation layer and the second inorganic encapsulation layer are flush in the thickness direction of the display panel.

13. A display device comprising a display panel;

wherein the display panel is divided into a display area and a peripheral area surrounding the display area, and the display panel comprises:

a driving backplane;

an inorganic encapsulation layer arranged on the driving backplane and covering the display area and a part of the peripheral area, wherein the inorganic encapsulation layer is formed on the driving backplane by a mask using a vapor deposition method, so that the inorganic encapsulation layer comprises a main encapsulation layer which covers the display area and a part of the peripheral area and an infiltration layer which extends from the main encapsulation layer towards a direction away from the display area; and an inorganic layer arranged on a side of the inorganic encapsulation layer away from the driving backplane, wherein an edge of the inorganic layer and an edge of the inorganic encapsulation layer are flush in a thickness direction of the display panel, and both the edge of the inorganic layer and the edge of the inorganic encapsulation layer are located in the peripheral area;

wherein the infiltration layer which is formed by infiltrating of an inorganic material, which is used for forming the main encapsulation layer, between the mask and the driving backplane and is at an outside of a barrier dam in the display panel, is removed.

14. The display device according to claim 13, wherein the inorganic layer is a buffer layer in a touch function layer, and an edge of the buffer layer and the edge of the inorganic encapsulation layer are flush in the thickness direction of the display panel.

15. The display device according to claim 13, wherein the inorganic layer is a touch insulating layer in a touch functional layer, and an edge of the touch insulating layer and the edge of the inorganic encapsulation layer are flush in the thickness direction of the display panel;

wherein the display panel further comprises a first touch electrode layer arranged between the inorganic encapsulation layer and the touch insulating layer, and a projection of the first touch electrode layer on the driving backplane is located within a projection of the inorganic encapsulation layer.

16. The display device according to claim 15, further comprising:

a buffer layer in the touch function layer, wherein the buffer layer is arranged between the inorganic encapsulation layer and the first touch electrode layer, and an edge of the buffer layer and edges of the touch insulating layer and the inorganic encapsulation layer are flush in the thickness direction of the display panel.

17. The display panel according to claim 13, further comprising:

the barrier dam arranged in the peripheral area and around the display area;

wherein the inorganic encapsulation layer covers the display area and the barrier dam, and the edge of the inorganic layer and the edge of the inorganic encapsulation layer are both located on a side of the barrier dam away from the display area.

18. The display panel according to claim 13, wherein the inorganic encapsulation layer comprises a first inorganic encapsulation layer and a second inorganic encapsulation layer which are stacked;

wherein the edge of the inorganic layer and edges of the first inorganic encapsulation layer and the second inorganic encapsulation layer are flush in the thickness direction of the display panel.

* * * * *